(12) United States Patent
Jan (10) Patent No.: US 7,358,549 B2
(45) Date of Patent: Apr. 15, 2008

(54) MULTI-LAYERED METAL ROUTING TECHNIQUE

(75) Inventor: Tzong-Shi Jan, Hsin-Chu (TW)

(73) Assignee: Taiwan Semiconductor Manufacturing Company (TW)

( * ) Notice: Subject to any disclaimer, the term of this patent is extended or adjusted under 35 U.S.C. 154(b) by 99 days.

(21) Appl. No.: 11/338,316

(22) Filed: Jan. 24, 2006

(65) Prior Publication Data

US 2006/0118826 A1    Jun. 8, 2006

Related U.S. Application Data

(62) Division of application No. 10/661,042, filed on Sep. 12, 2003, now Pat. No. 7,012,020.

(51) Int. Cl.
*H01L 29/73* (2006.01)
*H01L 29/40* (2006.01)

(52) U.S. Cl. .................. 257/210; 257/208; 257/211; 257/758; 257/776

(58) Field of Classification Search ........ 257/206–208, 257/210, 211, 758, 773, 776, E23.143, E23.145; 716/12–15
See application file for complete search history.

(56) References Cited

U.S. PATENT DOCUMENTS

| | | | |
|---|---|---|---|
| 4,612,629 A | 9/1986 | Harari | |
| 4,821,084 A | 4/1989 | Kinugasa et al. | |
| 5,311,156 A | 5/1994 | Andoh | |
| 5,447,876 A | 9/1995 | Moyer et al. | |
| 5,767,012 A | 6/1998 | Fulford et al. | |
| 5,923,059 A | 7/1999 | Gheewala | |
| 5,923,089 A | 7/1999 | Yao et al. | |
| 5,987,241 A | 11/1999 | Goldberg et al. | |
| 5,990,502 A | 11/1999 | Park | |
| 6,091,090 A | 7/2000 | Gheewala | |
| 6,177,703 B1 | 1/2001 | Cunningham | |
| 6,614,049 B1 * | 9/2003 | Koyama | ...................... 257/48 |
| 6,806,575 B2 | 10/2004 | Ireland | |

* cited by examiner

*Primary Examiner*—Hung Vu
(74) *Attorney, Agent, or Firm*—Duane Morris, LLP (57) ABSTRACT

In accordance with the objectives of the invention a new method and structure is provided for the creation of multiple overlying layers of interconnect metal. A channel is reserved for the creation of via interconnects, no vias are placed on metal lines. The metal lines are stacked and parallel, whereby a space is provided between lines that is reserved for the creation of vias for layer interconnection. This structure can be repeated, the vias are placed on the therefore reserved channel, interconnections are provided to the interconnect traces.

12 Claims, 11 Drawing Sheets

MULTI-LAYERED METAL ROUTING TECHNIQUE

This application is a division of application Ser. No. 10/661,042 filed Sep. 12, 2003 now U.S. Pat. No. 7,012,020, the entirety of which is incorporated by reference herein.

BACKGROUND OF THE INVENTION (1) Field of the Invention

The invention relates to the fabrication of integrated circuit devices, and more particularly, to a method of routing multiple layers of metal.

(2) Description of the Prior Art

Ever increasingly complex and densely packaged semiconductor devices require extensive networks of interconnect metal, a requirement that is especially demanding in the design of standard cell and gate array containing devices in view of the repetitive nature of these structures.

The demands of creating interconnect metal is further driven by demands of creating designs such as gate arrays in basic patterns after which multiple of these patterns can be interconnected to create interconnections that are specifically customer dependent and by thereby creating specialized and unique customer designs. This provides a cost-effective method of creating high-density, high-performance customized devices that perform logic functions in addition to providing storage capabilities and functions of digital signal processing.

The requirements of improving device performance can only be met by increasing device density, an aspect of creating semiconductor devices that typically results in creating overlying layers of interconnect metal. These overlying layers of interconnect metal use multiple layers of metal, adjacent layers being interconnected by interfacing via connections.

The design of more complex and more densely spaced interconnect traces is constrained by limitations imposed by the device elements with which the interconnect metal interfaces. These constraints may be constraints of thermal heat dissipation or constraints of device performance and device miniaturization. With minimization of device elements, the interconnect traces are as a natural consequence also closer spaced while the number of overlying layers of interconnect metal simultaneously continues to expand. From this it is not difficult to conclude that constraints arise between overlying layers of metal and the vias that are used to provide interconnections between adjacent overlying layers of interconnect. Since the vias typically extend in a vertical direction, perpendicularly intersecting with the layers of interconnects to which the vias are connected, it must be expected that the placing of the vias provides a challenge. Incorrect placement of vias will readily lead to shorting of overlying layers that may or may not be adjacent layers.

A method is therefore required that provides for the creation of interconnect vias for multiple layers of overlying metal such that shorts and other device malfunctions of a reliability nature are avoided.

U.S. Pat. No. 5,987,241 (Goldberg et al.) shows routing techniques.

U.S. Pat. No. 5,990,502 (Park) shows an architecture with metallization routing tracks.

U.S. Pat. No. 6,091,090 (Gheewala) shows a power and signal routing technique.

U.S. Pat. No. 5,1923,098 (Yao et al.) shows a routing method.

U.S. Pat. No. 5,923,059 (Gheewala) reveals a cell and routing scheme.

SUMMARY OF THE INVENTION

A principal objective of the invention is to provide a method of creating overlying layers of interconnect metal that do not negatively affect device performance and device reliability.

In accordance with the objectives of the invention a new method and structure is provided for the creation of multiple overlying layers of interconnect metal. A channel is reserved for the creation of via interconnects, no vias are placed on metal lines. The metal lines are stacked and parallel, whereby a space is provided between lines that is reserved for the creation of vias for layer interconnection. This structure can be repeated, the vias are placed on the therefore reserved channel, interconnections are provided to the interconnect traces.

BRIEF DESCRIPTION OF THE DRAWINGS

FIGS. 1 through 5 show a prior art method of creating overlying layers of interconnect metal and the problems experienced there-with, as follows:

The invention is explained using FIGS. 6 through 12, as follows:

DESCRIPTION OF THE PREFERRED EMBODIMENTS

The ground rules that are provided by the invention are stated first, examples of the ground rules will be shown using FIGS. 1 through 6 for that purpose.

Before the prior art methods are explained, it is of value to first highlight the method and structure on which the invention is based. The invention provides for:

reserving a channel for the creation of via interconnects vertically overlying the channel creating no vias on parallel interconnect traces of the interconnect network stacking the interconnect traces providing parallel interconnect traces creating multiple overlying layers of metal by repeating a basic pattern of interconnect and there-with associated vias, and placing the vias over the therefore reserved channel and providing interconnects between the vias and the interconnect traces.

Prior Art methods of creating interconnect metal and the there-with experienced problems will now be explained using FIGS. 1 through 6.

Figure 1:
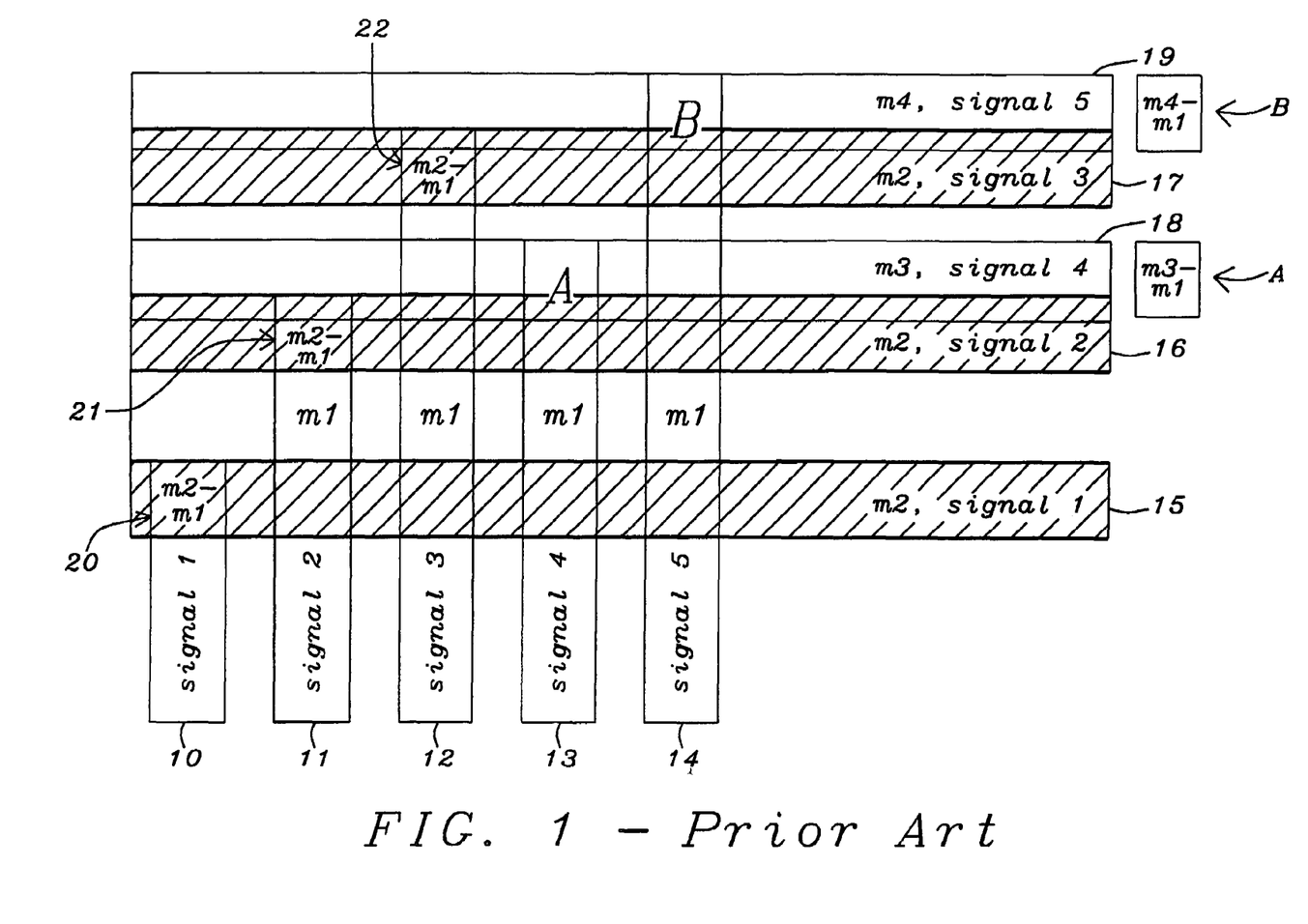
FIG. 1 shows a top view of four conventionally created overlying layers of interconnect metal.

Referring now specifically to FIG. 1, there is shown in top view of four levels of overlying metal interconnect traces. This top view is shown to highlight problems encountered there-with in interconnecting the overlying layers.

The following nomenclature is used to indicate the various layers of metal: $m_x$ is the metal of layer x, so that for instance $m_1$ refers to the first layer of metal, $m_3$ refers to the third layer of metal etc. It is thereby understood that the term "layer of metal" implies a patterned layer of metal that contains interconnect traces, the combined layers of interconnect traces form a multi-layered configuration of interconnects created over a substrate.

The four layers of metal shown in top view in FIG. 1 are metal traces 10-14 of $m_1$, 15 and 16 of $m_2$, 18 of $m_3$ and 19 of $m_4$. For each of these layers, the function that is required of the created interconnect traces is highlighted as Signal y, wherein "y" is a numerical value that highlights how a signal is expected to propagate through the network of traces that is shown in FIG. 1.

For instance, starting in the lower left corner of FIG. 1, with the vertically running traces 10-14 being metal $m_1$, Signal 1 is propagated to level 2 ($m_2$) trace 15. For this to happen, $m_1$ trace 10 must be connected to $m_2$ trace 15, this interconnection is provided in the intersection 20 of traces 10 and 15.

This same line of reasoning can be followed for the other layers of metal shown in top view in FIG. 1.

For instance, signal 4 on $m_1$ trace 13 propagates to third level metal $m_3$ on trace 18 via the intersection "A". In so doing however it must be realized that this interconnection between $m_1$ and $m_3$, since this interconnecting via proceeds in a direction that is perpendicular to the plane of the top view shown in FIG. 1, must bypass (while not intersecting with) $m_2$ trace 16.

The top view that is shown in FIG. 1 highlights that this is not the case since. In the top view of FIG. 1, traces 16 and 18 overlap within the highlighted surface area A, the interconnecting via between $m_1$ trace 13 and $m_3$ trace 18 therefore introduces a short with $m_2$ trace 16 in area "A".

If therefore $m_a$-$m_b$ designates an interconnection between metal layers $m_a$ and $m_b$, then it can be stated that, for surface area A, which is the intersection of $m_3$ trace 18 and $m_1$ trace 13, that: if the $m_2$-$m_1$ interconnect is made in area A, signal 2 (on trace 16) and signal 4 (on trace 13) will short.

The same can be concluded for area B, which is the intersection of $m_4$ trace 19 and $m_1$ trace 14: if the $m_4$-$m_1$ interconnect is made in area B, signal 3 (on $m_2$ trace 17) and signal 5 (on $m_4$ trace 19) will short.

Interconnect 20 is the interconnect $m_2$-$m_1$ for signal 1, interconnect 21 is the interconnect $m_2$-$m_1$ for signal 2 and interconnect 22 is the interconnect $m_2$-$m_1$ for signal 3.

From the above the general conclusion can be drawn that interconnect vias, which must interconnect overlying but not necessarily adjacent layers of metal traces, may cause shorts with intervening layers of metal to which these interconnect vias are not meant to be connected. The invention addresses this issue.

Figure 2:
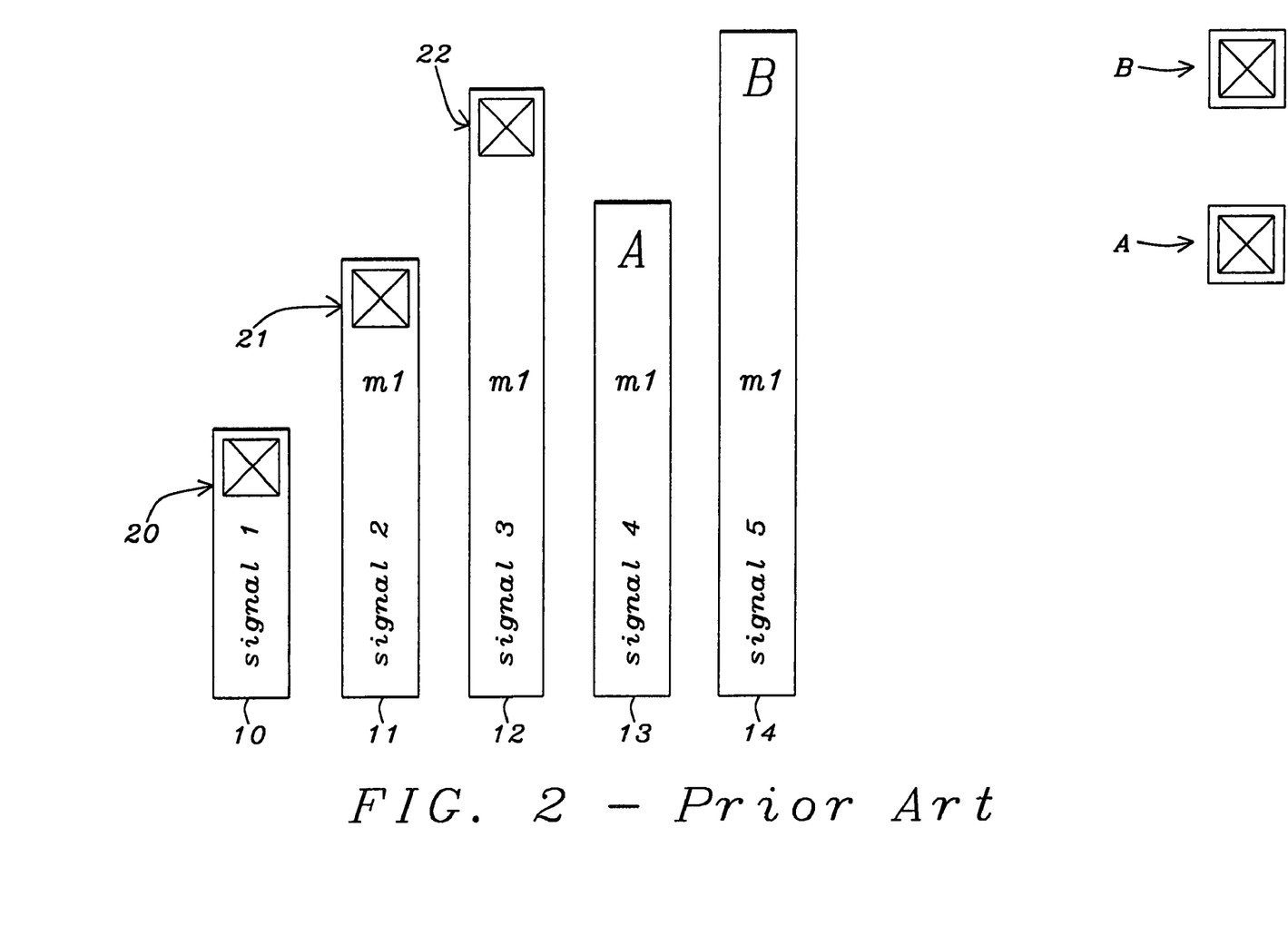
FIG. 2 shows a top view of a conventional interconnect scheme comprising metal 1.

FIG. 2 shows a top view of the metal 1 layers 10-14 as these layers have previously shown in FIG. 1, these layers are shown separate in order to better highlight the issue that is addressed by the invention. Via connections 20, 21 and 22 have been highlighted, via connections A and B that result in electrical shorts as explained above have also been indicated.

In the top view that is shown in FIG. 2 of the metal 1 layers 10-14, the previously drawn conclusion is still valid;

if the $m_2$-$m_1$ interconnect is made in area A, signal 2 and signal 4 will short, and if the $m_4$-$m_1$ interconnect is made in area B, signal 3 and signal 5 will short.

Figure 3:
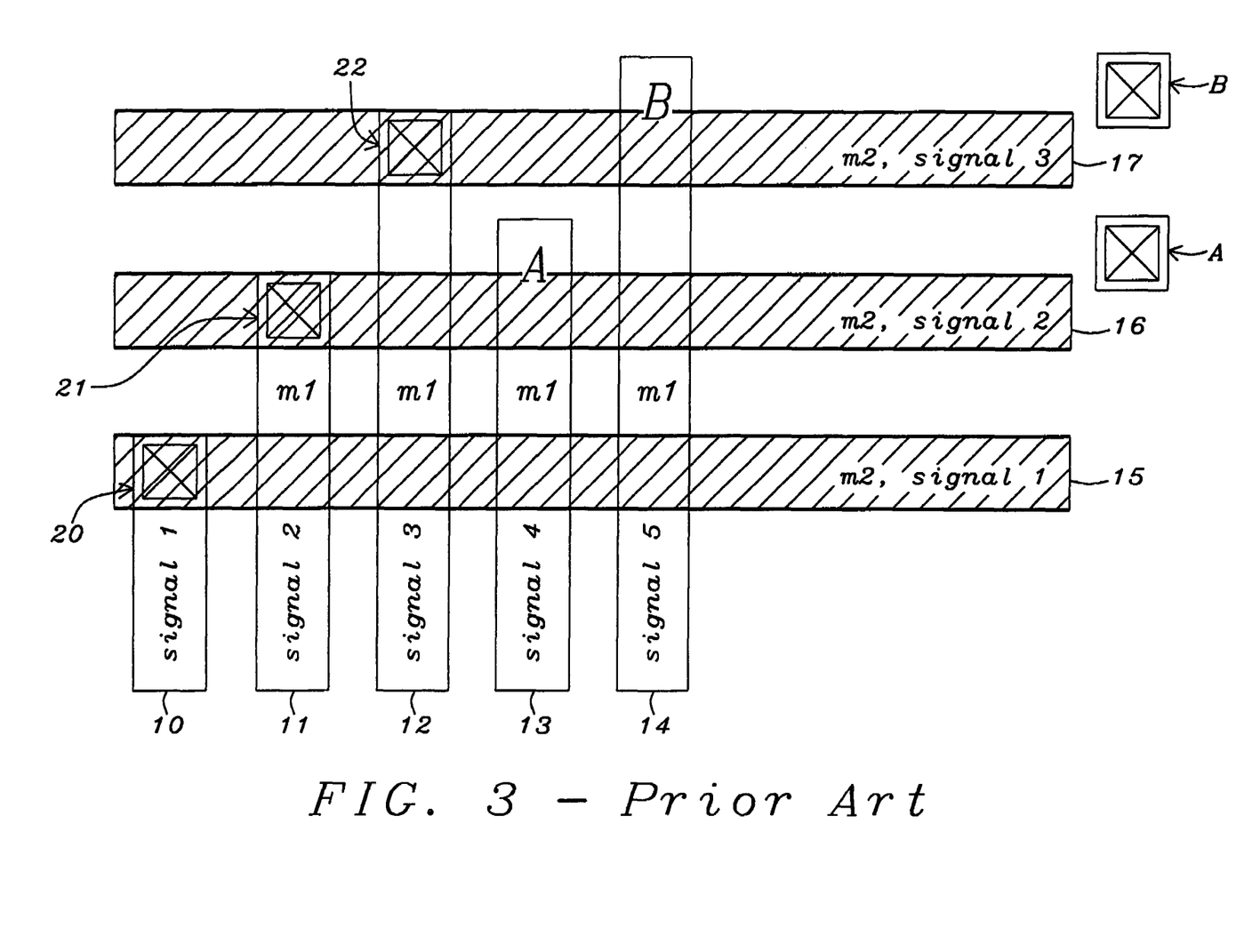
FIG. 3 shows a top view of conventional metal 1, metal 2 and via layers.

By adding level 2 metal to the top view that is shown in FIG. 2, the top view that is shown in FIG. 3 is obtained.

Figure 4:
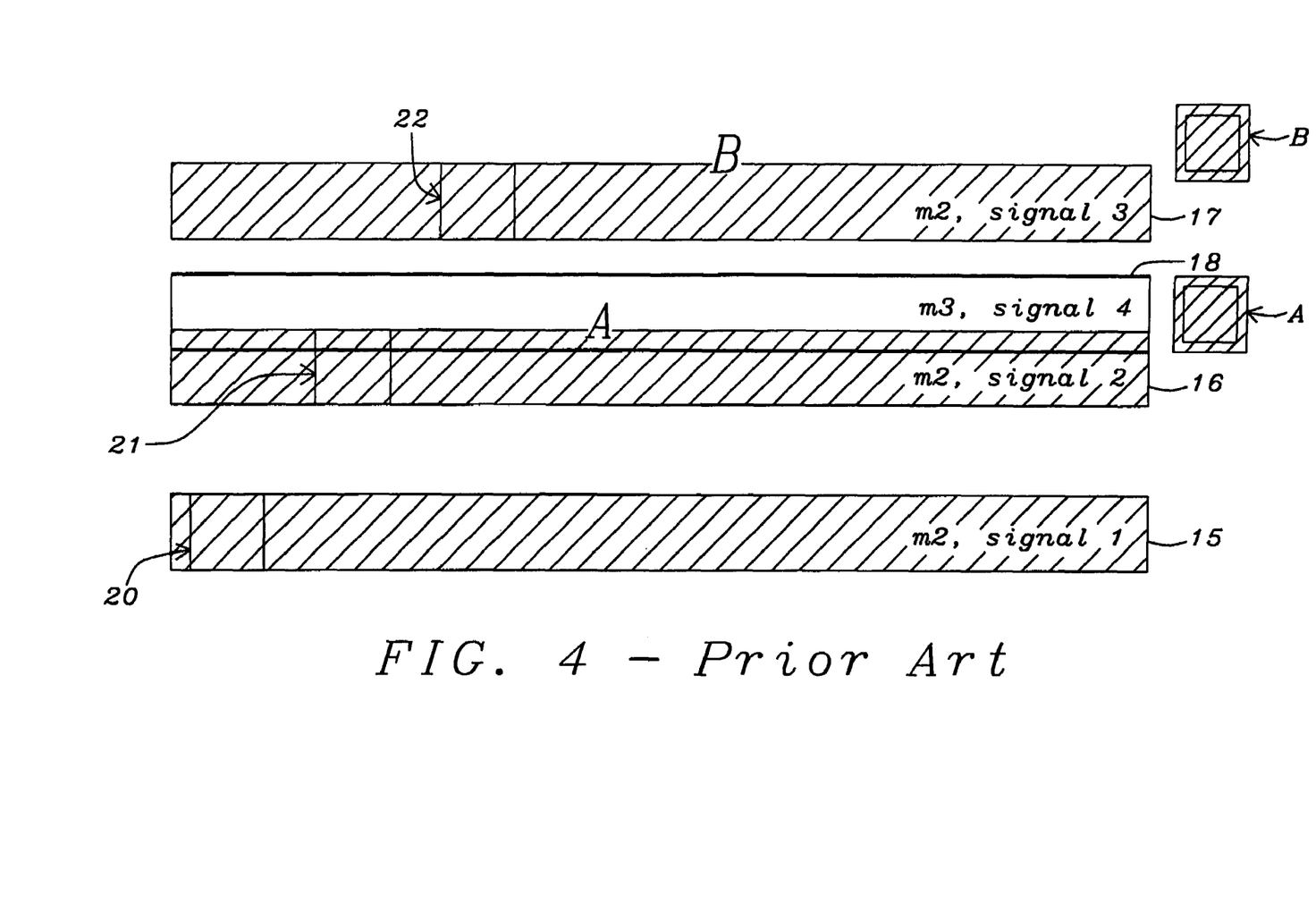
FIG. 4 shows a top view of conventional metal 2 and metal 3 and via layers.

By adding level 3 metal and a via layer to the level 2 metal that is shown in top view in FIG. 3, the top view that is shown in FIG. 4 is obtained.

Figure 5:
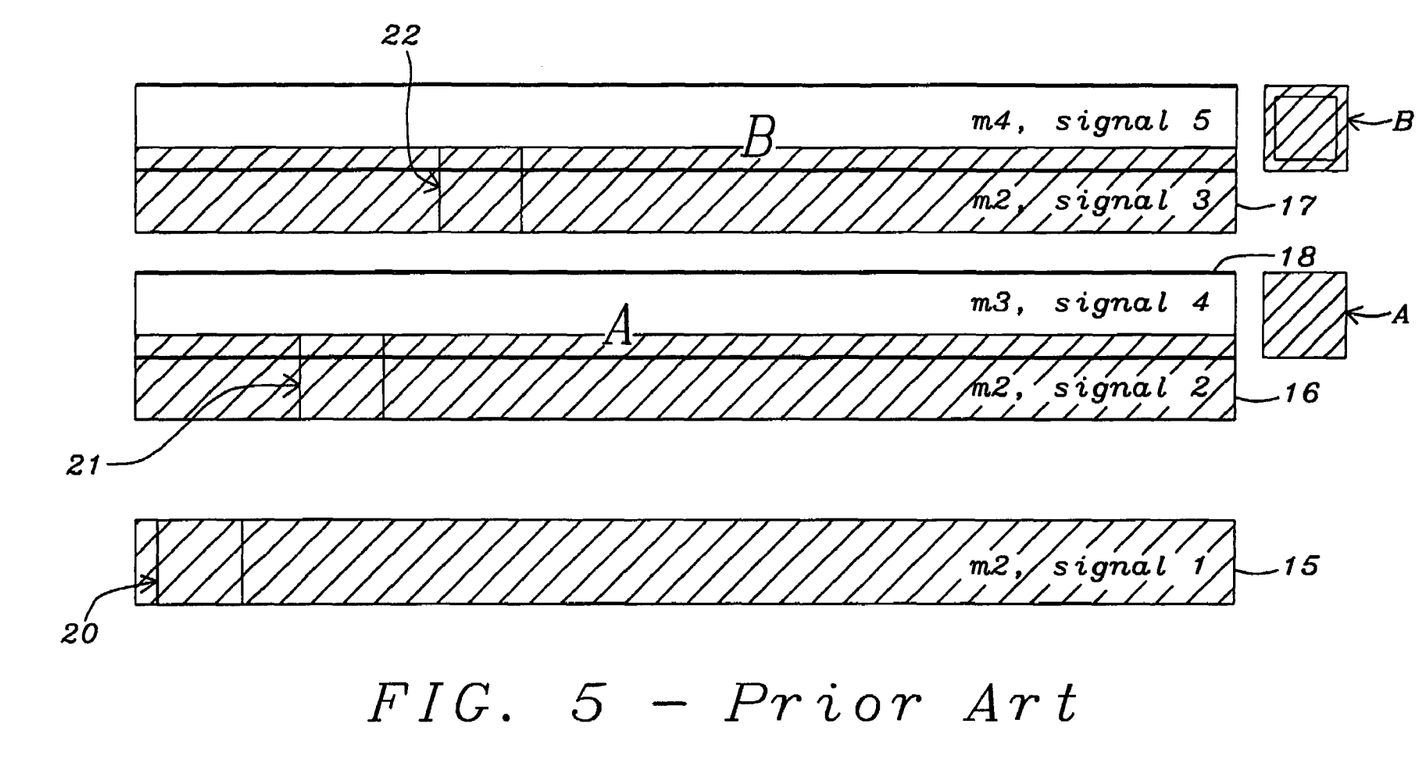
FIG. 5 shows a top view of conventional metal 2, metal 3, metal 4 and via layers.

By adding level 5 metal and a via layer to the top view that is shown in FIG. 4, the top view that is shown in FIG. 5 is obtained.

FIGS. 2 through 5 can be summarized as follows:

FIG. 2 shows a top view of metal 1 and one via layer

FIG. 3 shows a top view of metal 1 and metal 2 and one via layer

FIG. 4 shows a top view of metal 2 and metal 3 and two via layers, and

FIG. 5 shows a top view of metal 2 through metal 4 and three via layers.

The invention will now be explained using FIGS. 6 through 12.

Figure 6:
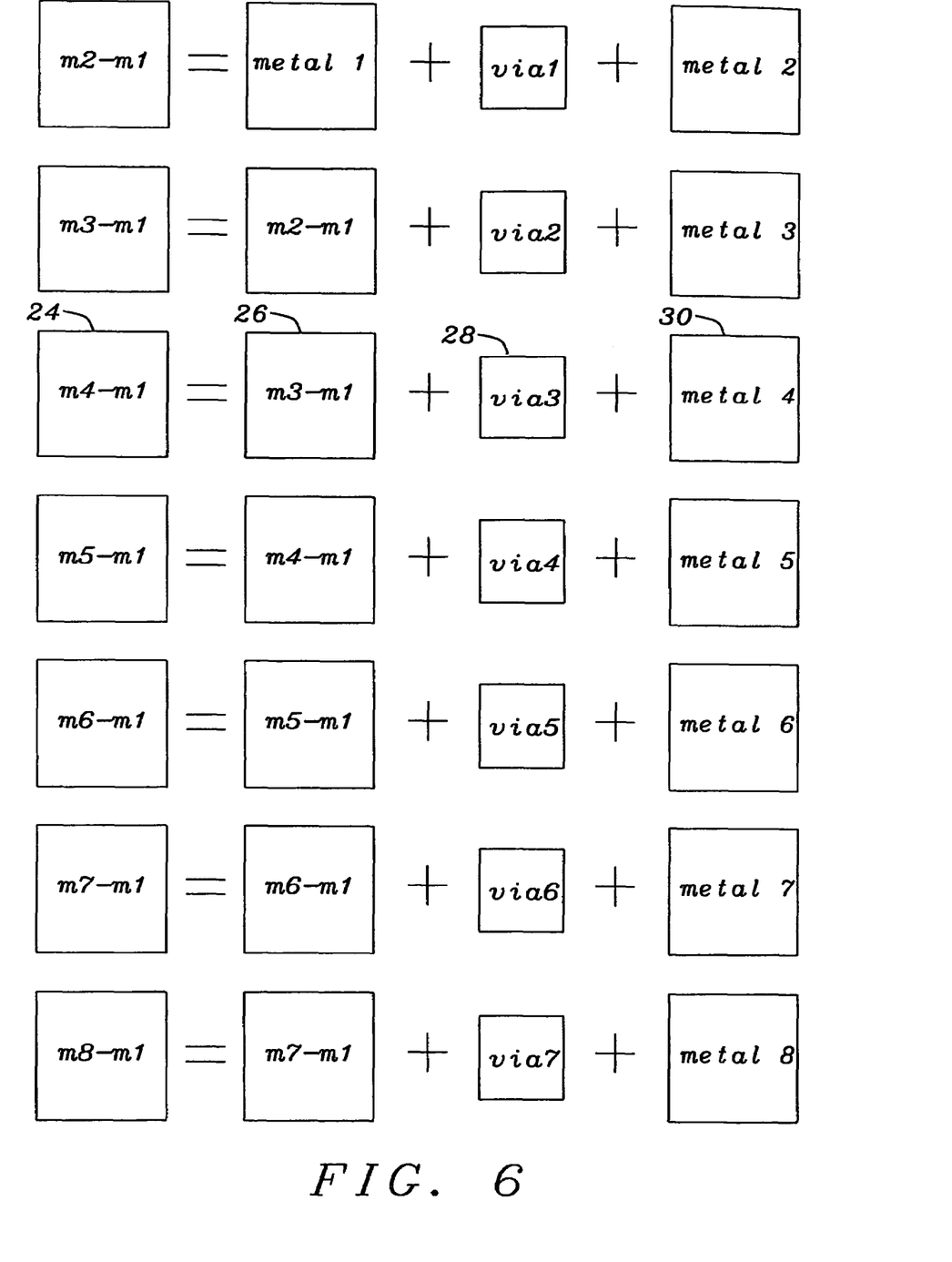
FIG. 6 highlights the basic interconnect scheme of the invention comprising multiple layers of overlying metal interconnect traces and vias.

FIG. 6 highlights the basic scheme of the invention, which shows that a connection to a higher level of metal is achieved by adding a via to an immediately lower level of metal, whereby the immediately lower level of metal has been connected to first level metal $m_1$.

As a representative example of the levels and their interconnects that have been shown in FIG. 6 the interconnect 24 has been highlighted, this is a $m_4$-$m_1$ interconnect that is created, as highlighted in FIG. 6, by adding a via 28 to the $m_3$-$m_1$ interconnect 26, connecting level four metal ($m_4$) 30 to this via 28. To establish the $m_4$-$m_1$ interconnect 24, the $m_3$-$m_1$ interconnect 26 is taken as a basis, via 28 is added to this $m_3$-$m_1$ interconnect basis 26, establishing contact between metal 4 and metal 1.

This latter statement can be generalized as follows: assume that a compound layer of overlying interconnect traces comprises 6 layers of metal traces, these 6 layers of metal traces must be interconnected with the objective of propagating 10 signals from the first layer to the overlying 5 layers. The first layer of metal is referred to as metal 1, the overlying 5 layers of metal are referred to as metal 2 through metal 6.

The following is provided by the invention:

the first layer of metal 1 is provided with 10 feeder traces, equal to the number of signals that must be propagated the feeder traces perpendicularly intersect with the interconnect traces of the overlying 5 layers of metal 2 through metal 6 the feeder traces end in a (linear) channel area over which no interconnect traces are (allowed to be) provided, the channel area therefore is a surface area that is part of the plane comprising the metal 1 traces the layer of metal 2 traces is created, a total of 10 metal 2 vias are provided, these 10 interconnect vias are aligned with the ends of the metal 1 feeder traces, providing a total of 10 metal 2 vias that are connected with the metal 1 ends of the metal 1 feeder traces the metal 2 traces are connected to two of the 10 metal 2 vias, leaving 8 open or not connected metal 2 vias the layer of metal 3 is created, the remaining 8 metal 2 vias are continued to the plane of the metal 3 traces by creating 8 metal 3 vias that are aligned with the remaining 8 metal 2 vias metal 3 is connected to 2 of the created metal 3 vias, leaving 6 remaining metal 3 vias the layer of metal 4 is created, the remaining 6 metal 3 vias are continued upwards into the plane of the metal 4 traces by creating 6 metal 4 vias that are aligned with the remaining 6 metal 3 vias metal 4 is connected to 2 of the 6 metal 4 vias, leaving 4 remaining metal 4 vias the layer of metal 5 is created, the remaining 4 metal 4 vias are continued upwards into and through the plane of the metal 5 traces by creating 4 metal 5 vias that are aligned with the remaining 4 metal 4 vias, and metal 5 is connected to 2 of 4 metal 5 vias, leaving 2 remaining metal 5 vias the layer of metal 6 is created, the remaining 2 metal 5 vias are continued upwards into and through the plane of the metal 6 traces by creating 2 metal 6 vias that are aligned with the remaining 2 metal 5 vias, and metal 6 is connected to the 2 metal 6 vias.

All other levels of metal and the scheme that is followed in interconnecting these levels of metal follow the method as shown in the example for metal 24, 26, 28 and 30.

It must thereby be realized that this scheme of creating metal interconnects is not limited or meant to be limited to referring all overlying layers of interconnect to a first level of metal $m_1$. This would make it impossible to interconnect higher layers of metal if these layers do not need to be connected to a first layer of metal.

By designating an intermediate layer of metal as a (new) first layer of metal, overlying layers can further be connected to this new first layer of metal without thereby being connected to layers of metal that are located below the new first layer of metal. In this manner, any number of overlying layers of interconnect traces can be created whereby interconnect vias can originate at any level within the structure.

Figure 7:
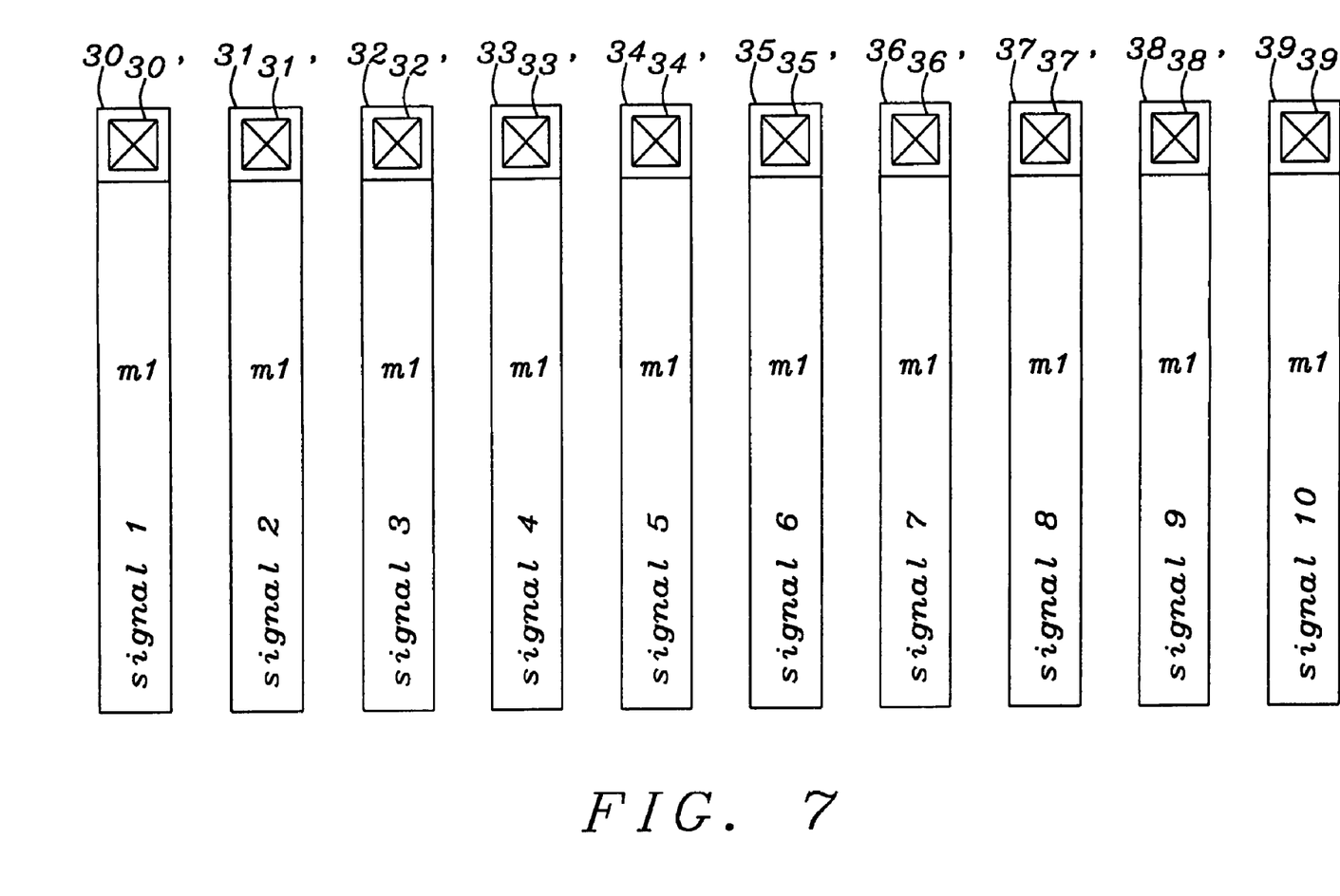
FIG. 7 shows a top view of metal 1 and via 1 layers.

Referring now specifically to FIG. 7, there is shown a top view of a layer of metal 1 and a first layer of vias created over the first layer of metal.

Signal lines 30-39 have been shown as examples, these signal lines are provided for the propagation of Signal 1 through Signal 10 as highlighted in the top view of FIG. 7. For instance, first level interconnect trace 34 propagates signal 5, etc. At an extremity of each of the signal lines 30-39, an overlying interconnect via is provided. For instance, at the extremity of first level interconnect trace 37 via 37' is provided. All interconnect vias 30' through 39' are similarly provided.

Figure 8:
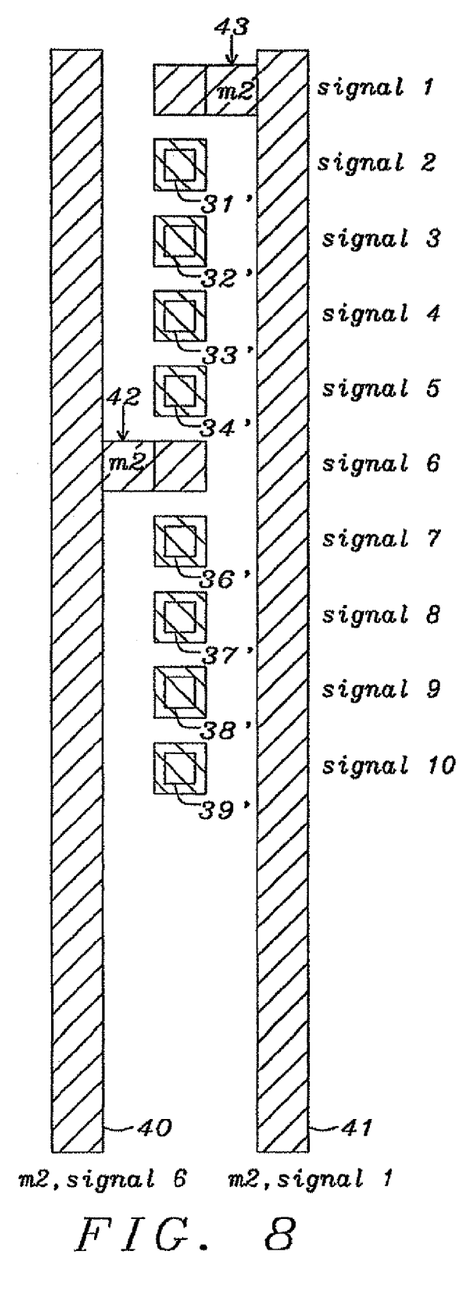
FIG. 8 shows a top view of metal 2 and via 2 layers.

In the top view that is shown in FIG. 8, metal 2 interconnect:

trace 40 is connected to underlying metal 1 by means of interconnect 42 and via 35' trace 41 is connected to underlying metal 1 by means of interconnect 43 and via 30'.

It is at this time of value to again review the ground rules that are applied by the invention, since these ground rules become apparent from the top view shown in FIG. 8, as follows:

reserving a channel for the creation of via interconnects vertically overlying the channel, this channel has as center line the line connecting vias 30' and 39' while extending over a distance from this line creating no vias on parallel interconnect traces of the interconnect network, such as interconnect traces 40 and 41, FIG. 8 stacking the interconnect traces, such as interconnect traces 40 and 41, FIG. 8; overlying traces are therefore provided in a plane that is perpendicular to the plane in which preceding traces have been created the interconnect traces are parallel, such as traces 40 and 41 placing the vias, such as vias 30' through 39', over the channel and providing interconnects, such as interconnects 42 and 43, between the vias and the interconnect traces; interconnect 42 connects via 35' (and therewith metal 1 trace 35) to metal 2 trace 40, interconnect 43 connects via 30' (and therewith metal 1 trace 30) to metal 2 trace 41, and multiple overlying layers of metal can be created by repeating a basic pattern of interconnect and there-with associated vias.

It must be noted in the top view shown in FIG. 8 that vias 31'-34' and 36'-39' are provided in the metal 2 plane of which traces 40 and 41 are metal interconnects. The numbers that are used for the vias provided in overlying layers of metal will be maintained as the same numbers as they have been designated in the metal 1 layer of FIG. 7. Where these vias are shown in layers of metal other than metal 1, it is to be understood that these vias are not (the original) vias 30'-39' but are extensions thereof in the plane in which they are shown. For instance, vias 31'-34' and 36'-39', shown in the top view of FIG. 8, are not physically the same vias as shown in FIG. 7 but are extensions thereof in the overlying level of metal 1.

By repeating this process of interconnecting overlying layers for additional layers of metal, all overlying layers of metal can be interconnected.

Figure 9:
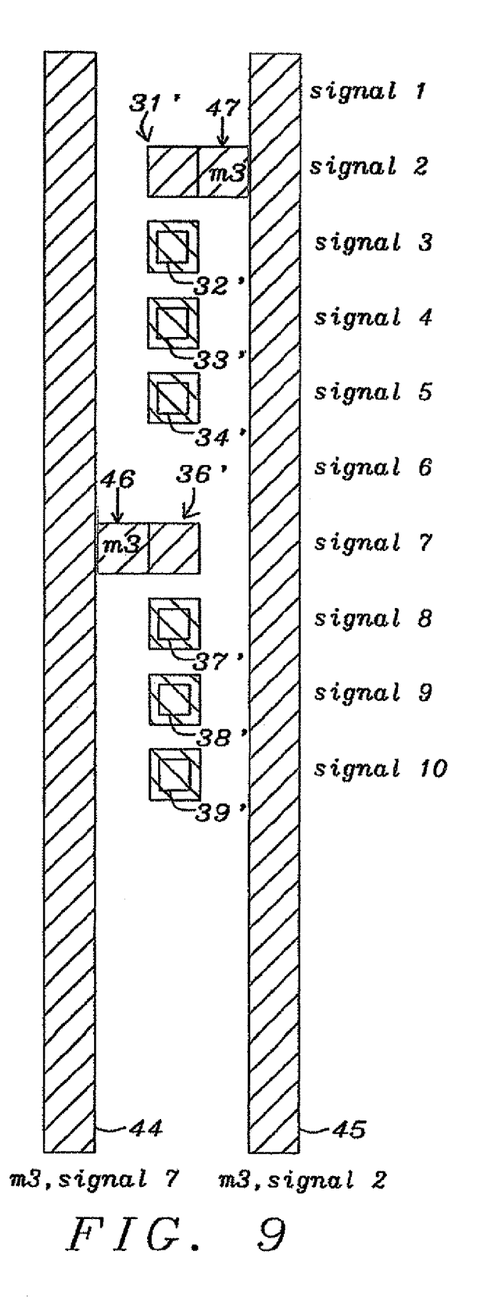
FIG. 9 shows a top view of metal 3 and via 3 layers.

FIG. 9 shows a top view of metal 3 being interconnected to metal 1, specifically:

44 and 45 are two metal 3 interconnect traces

46 and 47 are two interconnects to underlying interconnect vias interconnect 46 connects metal 1 signal 7, by means of via 36' and extensions thereof with metal 3 interconnect trace 44 interconnect 47 connects metal 1 signal 2, by means of via 31' and extensions thereof with metal 3 interconnect trace 45 interconnect vias 32'-34' and 37'-39' are extended into the plane of metal 3.

Figure 10:
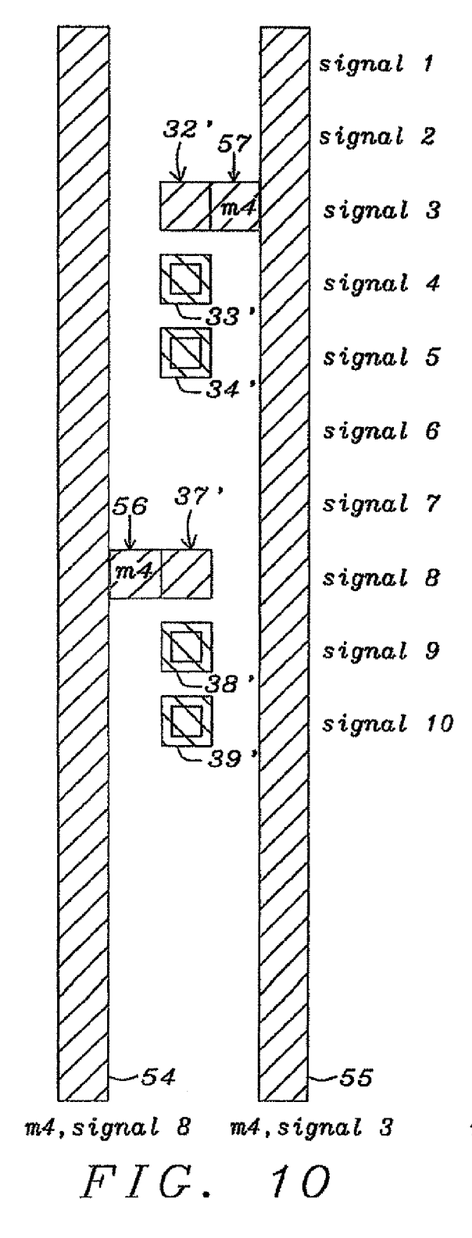
FIG. 10 shows a top view of metal 4 and via 4 layers.

FIG. 10 shows a top view of metal 4 being interconnected to metal 1, specifically:

54 and 55 are two metal 4 interconnect traces

56 and 57 are two interconnects to underlying interconnect vias interconnect 56 connects metal 1 signal 8, by means of via 37' and extensions thereof with metal 4 interconnect trace 54 interconnect 57 connects metal 1 signal 3, by means of via 32' and extensions thereof with metal 4 interconnect trace 55 interconnect vias 33'-34' and 38'-39' are extended into the plane of metal 4.

Figure 11:
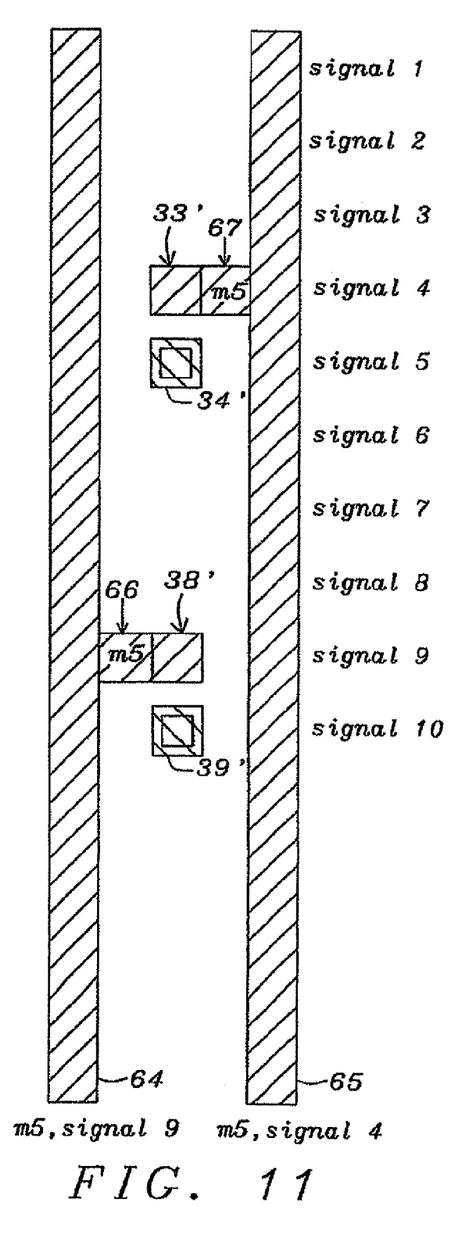
FIG. 11 shows a top view of metal 5 and via 5 layers.

FIG. 11 shows a top view of metal 5 being interconnected to metal 1, specifically:

64 and 65 are two metal 5 interconnect traces 66 and 67 are two interconnects to underlying interconnect vias interconnect 66 connects metal 1 signal 9, by means of via 38' and extensions thereof with metal 5 interconnect trace 64 interconnect 67 connects metal 1 signal 4, by means of via 33' and extensions thereof with metal 5 interconnect trace 65 interconnect vias 34' and 39' are extended into the plane of metal 5.

Figure 12:
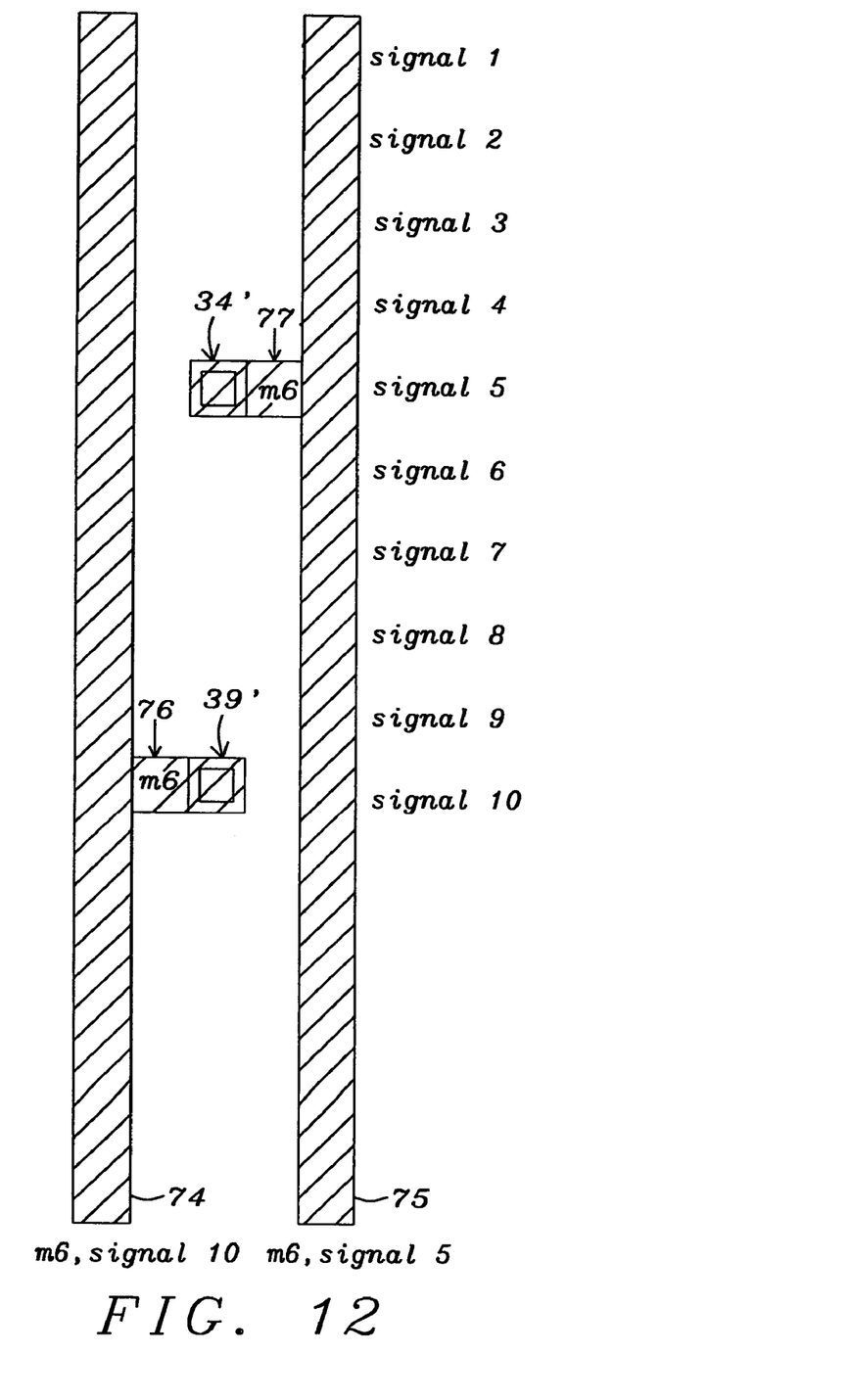
FIG. 12 shows a top view of metal 6 and via 6 layers.

FIG. 12 shows a top view of metal 6 being interconnected to metal 1, specifically:

74 and 75 are two metal 6 interconnect traces 76 and 77 are two interconnects to underlying interconnect vias interconnect 76 connects metal 1 signal 10, by means of via 39' and extensions thereof with metal 6 interconnect trace 74 interconnect 77 connects metal 1 signal 5, by means of via 34' and extensions thereof with metal 6 interconnect trace 75.

Superimposing the top view that have been shown in FIGS. 7 through 12 would show the "complete picture" of the interconnects of the invention. Since however such a superimposition would result in an extremely complex figure and since such a complex figure would not add to the explanation of the invention, this superimposed image is not considered clear and is therefore not shown.

Figure 13A:
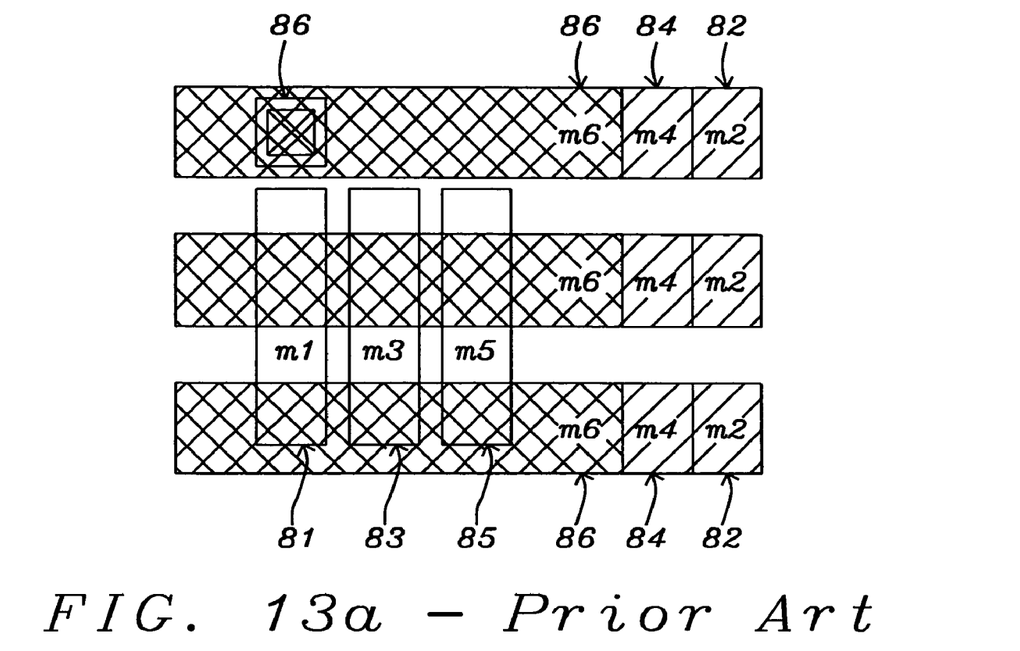
FIGS. 13a and 13b shown a comparison of conventional and the new method of providing interconnects in overlying layers of metal traces.
Figure 13B:
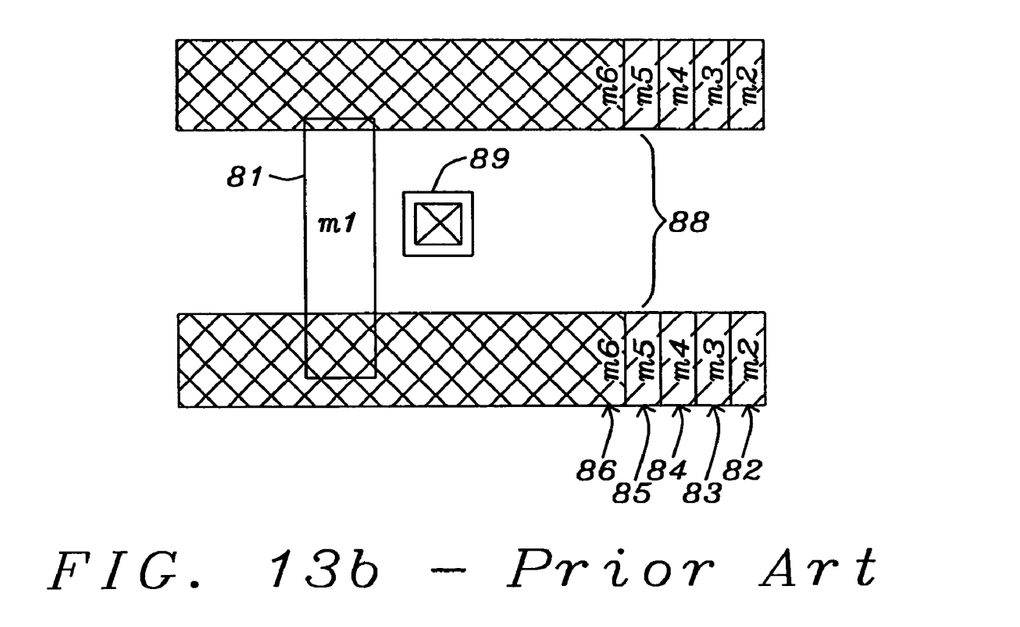

As a further comparison of conventional and the new method of providing interconnects in overlying layers of metal traces, FIGS. 13a and 13b are shown. In FIG. 13a, the conventional method of interconnecting overlying metal traces is shown. Metal layers 81 ($m_1$), 83 ($m_3$) and 85 ($m_5$) perpendicularly intersect metal layers 86 ($m_6$), 84 ($m_4$) and 82 ($m_2$). Interconnecting vias 86 are provided where required and subject to the limitations that have been highlighted using FIGS. 1 through 6.

The top view shown in FIG. 13b highlights the invention, where:

a channel 88 is reserved for the creation of via interconnects vertically overlying the channel no vias are created on parallel interconnect traces 82-86 of the interconnect network the interconnect traces 82-86 are stacked the interconnect traces 82-86 are parallel the vias 89 are placed over the channel 88 and provide interconnects (not shown in FIG. 13b) between the vias 89 and the interconnect traces 82-86 multiple overlying layers of metal can be created by repeating a basic pattern of interconnect and there-with associated vias.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A structure of multi-layered conductive interconnects, comprising:

a substrate, with semiconductor devices in or over the substrate, and at least one point of electrical contact over the substrate;

a first layer of conductive material comprising at least one first level conductive interconnect in a first direction having an end surface;

a channel over the first layer of conductive material having a central axis perpendicular with said first direction, said central axis overlying said end surface;

at least one overlying layer of conductive material, comprising:

(i) at least one overlying conductive material interconnect not overlying said channel in a second direction, said second direction perpendicular with said first direction;

(ii) at least one via over said end surface area of said at least one first level conductive interconnect and making contact therewith;

wherein the at least one via overlies said channel.

2. The structure of claim 1, further comprising at least one interconnect between said at least one overlying conductive material interconnect and said at least one via.

3. A structure of multi-layered metal interconnects, comprising:

a substrate, with semiconductor devices in or over the substrate, and at least one point of electrical contact over the substrate;

at least one layer of interconnect metal over the substrate, comprising:

(i) a first layer of metal comprising at least one first level metal interconnect in a first direction having an end surface;

(ii) a channel defined over the first layer of metal having a central axis perpendicular with said first direction, said central axis overlying said end surface;

(iii) at least one additional layer of metal, comprising:

(a) at least one metal interconnect not overlying said channel in a second direction, said second direction perpendicular with said first direction; and (b) at least one via over said end surface area of said at least one first level metal interconnect and making contact therewith;

wherein the at least one via overlies the channel.

4. The structure of claim 3, further comprising at least one interconnect between said at least one metal interconnect not overlying said channel and said at least one via.

5. The structure of claim 1, wherein:

said structure has a plurality of points of electrical contact over the substrate;

the first layer of conductive material comprises multiple first level conductive material interconnects in the first direction, each having an end surface, said end surfaces of said multiple first level conductive material interconnects being linearly positioned;

the structure has a plurality of overlying levels of conductive material interconnect, each comprising:

(i) a conductive material interconnect not overlying said channel in the second direction;

(ii) a via over said end surface area of a respective one of said multiple first level conductive material interconnects and making contact therewith.

6. The structure of claim 5, wherein the structure includes a plurality of interconnects between said conductive material interconnects not overlying said channel and said vias.

7. The structure of multi-layered metal interconnects of claim 5, wherein said conductive material interconnects not overlying said channel are stacked and parallel.

8. The structure of claim 1, wherein:

the substrate has a plurality of semiconductor points of electrical contact over the substrate;

the first layer of conductive material comprises multiple first level conductive material interconnects in the first direction having associated end surfaces, said end surfaces of said multiple first level conductive material interconnects being linearly positioned; and the structure includes a plurality of additional levels of interconnect conductive material, comprising:
  (i) a plurality of conductive material interconnects not overlying said channel in the second direction, said conductive material interconnects of additional levels of interconnect conductive material being stacked and parallel;
  (ii) at least one joining interconnect between conductive material of a level of interconnect and a surface area of said level of interconnect that is located over an end surface of said first layer of conductive material; and
  (iii) at least one via connecting said joining interconnect with said end surface of said first layer of conductive material.

9. The structure of claim 1, wherein:

the substrate has a plurality of points of electrical contact over the substrate;

the first layer of conductive material comprises multiple first level conductive interconnects in the first direction having associated end surfaces, said end surfaces of said multiple first level conductive interconnects being linearly positioned;

the channel has borders separated from said central axis by a distance;

and the structure has a plurality of overlying levels of conductive interconnects, comprising:
  (i) conductive interconnects not overlying said channel in the second direction;
  (ii) multiple conductive vias over said end surface area of said multiple first level conductive interconnects and making contact with a subset thereof; and
  (iii) interconnects between said multiple first level conductive interconnects and said multiple conductive vias.

10. The structure of multi-layered metal interconnects of claim 9, wherein said conductive interconnects not overlying said channel are stacked and parallel.

11. The structure of claim 1, wherein:

the substrate has a plurality of points of electrical contact over the substrate;

the first layer of conductive material comprises multiple first level conductive interconnects in the first direction with associated end surfaces, said end surfaces of said multiple first level conductive interconnects being linearly positioned;

the channel has borders separated from said central axis by a distance, said central axis overlying said end surfaces; and the structure has additional levels of conductive interconnects, comprising:
  (i) conductive interconnects not overlying said channel in the second direction, conductive interconnects of additional levels of conductive interconnects being stacked and parallel;
  (ii) at least one joining conductive interconnect between conductive material of a level of conductive interconnect and a surface area of said level of conductive interconnect that is located over an end surface of said first layer of conductive interconnects; and
  (iii) at least one conductive via connecting said joining conductive interconnect with said end surface of said first layer of conductive interconnects.

12. A multi-layered conductive interconnect, comprising:

a substrate having semiconductor devices in or over the substrate and at least one point of electrical contact over the substrate;

a first layer of conductive material comprising at least one first level conductive interconnect trace aligned in a first direction and having an end;

at least one additional layer of conductive material above the first layer of conductive material, the at least one additional layer having at least two metal interconnect traces aligned in a second direction perpendicular to the first direction, the at least two metal interconnect traces defining a channel therebetween, the channel overlying the end of the first level conductive interconnect trace said at least one additional layer of conductive material further comprising at least one via over said end surface of said at least one first level conductive interconnect trace and making contact therewith;

wherein the at least one via overlies the channel.

* * * * *